United States Patent [19]

Hartleroad et al.

[11] 3,960,279
[45] June 1, 1976

[54] MAGNETIC ALIGNMENT FOR SEMICONDUCTOR DEVICE BONDING

[75] Inventors: Ronald J. Hartleroad, Twelve Mile; James C. Krajewski; Ronald G. Rayon, both of Kakomo, all of Ind.

[73] Assignee: General Motors Corporation, Detroit, Mich.

[22] Filed: Mar. 28, 1975

[21] Appl. No.: 563,092

Related U.S. Application Data

[62] Division of Ser. No. 414,274, Nov. 9, 1973, Pat. No. 3,887,997.

[52] U.S. Cl............................... 214/1 BV; 294/65.5
[51] Int. Cl.².......................................... B01J 17/00
[58] Field of Search................. 29/203 P, 589, 626, 29/628; 214/1 R, 1 BS, 1 BT, 1 BH, 1 BV; 269/8; 198/41; 294/65.5

[56] References Cited
UNITED STATES PATENTS

| | | | |
|---|---|---|---|
| 3,047,933 | 8/1962 | Chick et al................. | 214/1 BH X |
| 3,089,600 | 5/1963 | Fischer, Jr..................... | 214/1 BT |
| 3,124,260 | 3/1964 | Tidball........................ | 214/1 BT X |
| 3,722,072 | 3/1973 | Beyerlein...................... | 29/589 X |
| 3,731,377 | 5/1973 | Muckelroy..................... | 29/626 |

*Primary Examiner*—Frank E. Werner
*Attorney, Agent, or Firm*—Robert J. Wallace

[57] ABSTRACT

A self-aligning method and apparatus for magnetically transferring semiconductor chips to corresponding fingers of a conductive lead frame for bonding thereto. A chip having a plurality of soft ferromagnetic integral leads on one face thereof is positioned face up, below overlying soft ferromagnetic fingers of the lead frame. A magnetic field is applied generally perpendicular to the underside of the chip and the fingers to produce lead-finger engagement. While producing this engagement, the chip is concurrently automatically oriented by the magnetic field to precisely align chip leads with corresponding lead frame fingers. In a preferred embodiment, a semiconductor flip chip having soft ferromagnetic contact bumps is placed face up on a tip of a soft iron probe extending from an electromagnet. The probe raises to position the chip into close proximity with the overlying lead frame fingers. A magnetic force from the electromagnet is then transmitted through the probe to raise the chip up off the probe and simultaneously rotate it horizontally into precise aligned engagement with the fingers so that it can be bonded thereto.

2 Claims, 6 Drawing Figures

MAGNETIC ALIGNMENT FOR SEMICONDUCTOR DEVICE BONDING

RELATED PATENT APPLICATION

This application is a division of U.S. patent application Ser. No. 414,274, now U.S. Pat. No. 3,887,997 entitled "Magnetic Alignment of Semiconductor Device Bonding", filed Nov. 9, 1973, in the names of Ronald J. Hartleroad, James C. Krajewski and Ronald G. Rayon, and assigned to the assignee of this application.

BACKGROUND OF THE INVENTION

This invention pertains to a method and apparatus for transferring and aligning integrally leaded semiconductor chips with conductive lead frame structures for permanently bonding thereto. More particularly, it involves the use of a magnetic force to raise the chip from a temporary carrier into engagement with an overlying lead frame and to concurrently automatically orient the chip while it is in transit, so that integral leads on the chip are precisely aligned with corresponding fingers of the lead frame.

One of the most time consuming and expensive steps in producing packaged semiconductor integrated circuit devices has been in the attachment of larger conductive leads to the integrated circuit chip to provide electrical connection to external circuitry. One technique is to bond filamentary wires which interconnect particular regions on the chip to corresponding leads of a conductive pattern on a rigid substrate, thereby making the electrical connection therebetween.

One can avoid the time consuming and expensive wire bonding operation by providing integral metal leads extending outwardly from one face of the chip. In a flip chip these leads extend perpendicular from the chip face, as contact bumps. In a beam leaded chip, the leads extend parallel to the chip face and are cantilevered over the edge of the chip. Such integral leads are extensions of a conductor pattern on the chip face, and serve as electrical interconnection points for larger conductive leads.

The larger conductive leads can be initially part of a lead frame having a plurality of spaced sets of inwardly convergent cantilevered fingers. The fingers of each set have free inner end portions which correspond to the integral lead pattern on the chip. In the usual lead frame constructed entirely of metal, the cantilevered fingers are unsupported at their free ends. Chips having contact bumps, popularly referred to as flip chips, can be attached to the lead frame by soldering the contact bumps directly to the corresponding finger free ends of the lead frame. This simultaneously produces a low resistance electrical connection between the bumps and respective fingers of the lead frame. While this alleviates the necessity for wire bonding, the chip still must be very precisely aligned so that the contact bumps are registered with their corresponding lead frame fingers.

One prior method of attaining this alignment involves supporting the back side of a flip chip on a small, needle-like vacuum chuck, and bringing the chip into engagement with overlying fingers of a lead frame extending parallel to the major surfaces of the chip. An operator manually raises and at least rotates the chuck while looking through a microscope to obtain good aligned contact bump-finger engagement. In many instances, the operator must also laterally move the chuck to get the proper register. This was time consuming, and therefore in high volume production proved to be expensive. In addition to the expense of such operations, it was inherently subject to human error due to the extremely small size of the chips. Moreover, the yields and reliability of the resultant devices depended upon the skill and precision of the individual operator, who before this invention had to manually align the chip and lead frame fingers.

In high volume production operations, the unsupported free ends of the converging lead frame fingers are frequently bent somewhat in handling so that they are not always precisely coplanar with one another. Furthermore, the height from contact bump to contact bump on an individual chip can vary. Therefore, substantial overtravel of the chuck is often needed to insure that every contact bump on a chip is intimately engaged with its corresponding finger. This chuck overtravel bends at least some and generally most of the fingers above their original plane. If the chip is bonded to the fingers while they are overstressed, a poor mechanical and electrical bond between the flip chip and the lead frame may result.

Through the use of our invention, integrally leaded semiconductor device chips can be automatically precisely aligned with lead frame structures without the necessity of manual alignment, thereby resulting in greater production efficiency and more reliable, stronger bonds.

SUMMARY AND OBJECTS OF THE INVENTION

Therefore, it is an object of this invention to provide a method and apparatus for magnetically transferring and automatically aligning semiconductor chips with conductive lead frame structures for bonding thereto.

It is a more specific object of this invention to provide an apparatus and method for magnetically raising a semiconductor chip from a temporary carrier to a conductive lead frame structure, concurrently automatically orienting the chip with corresponding fingers of the lead frame while the chip is being raised, and bonding the chip in place while it is in a uniform precisely aligned and low stress intimate engagement with the lead frame fingers.

These and other objects of the invention are accomplished by positioning a semiconductor chip having a plurality of soft ferromagnetic integral leads on one face thereof into closely spaced relation with overlying soft ferromagnetic fingers of a lead frame. A magnetic field is applied generally perpendicularly to the underside of the chip and the fingers which raises the chip up to the lead frame fingers and urges all fingers into intimate engagement with their corresponding chip leads. While in transit to the lead frame, the chip is concurrently automatically oriented by the magnetic field so that all of the chip leads are very precisely aligned with their corresponding lead frame fingers. The chip leads are then bonded to the lead frame fingers.

DESCRIPTION OF THE PREFERRED EMBODIMENT

Figure 1:
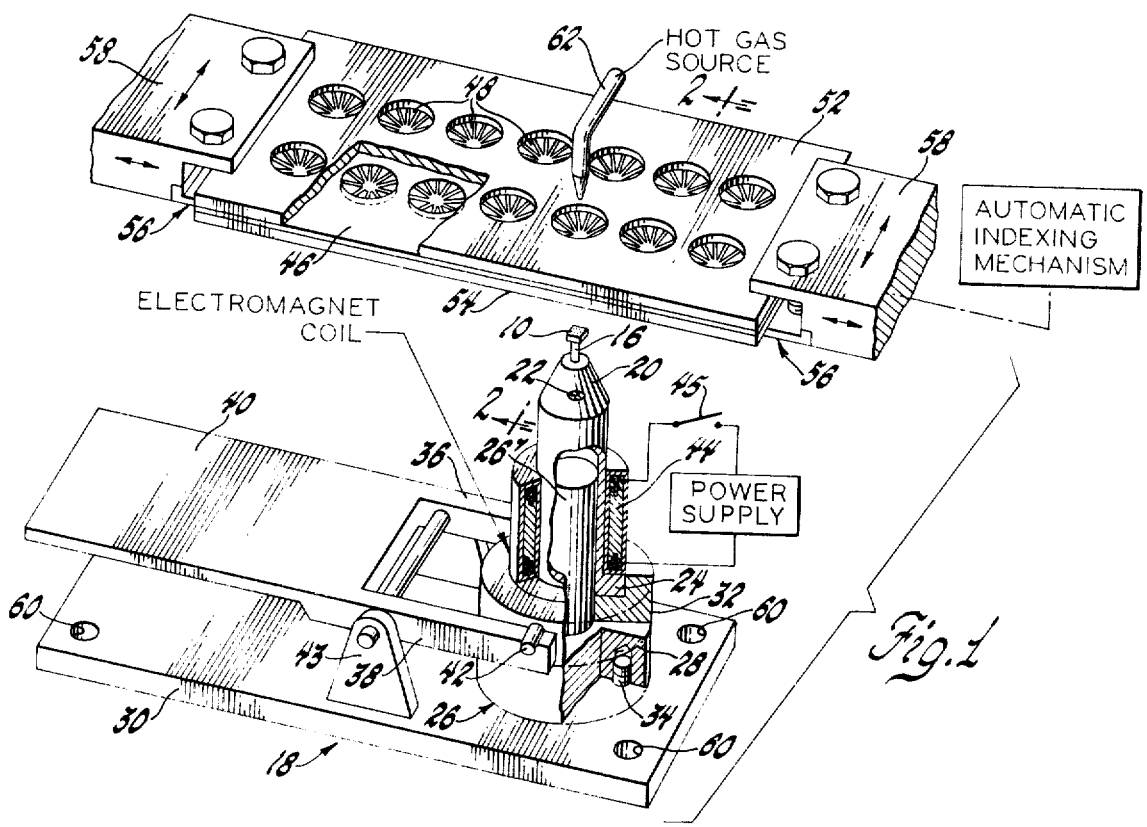
FIG. 1 is an isometric view showing the apparatus of this invention and which includes a semiconductor flip chip on a transfer probe under an overlying lead frame.
Figure 2:
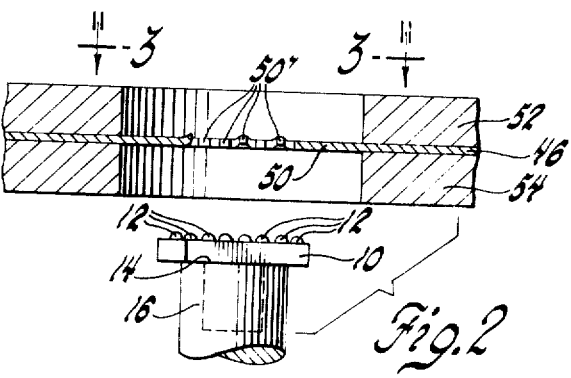
FIG. 2 is an enlarged partial sectional view along the lines 2—2 of FIG. 1 before chip transfer to the lead frame.
Figure 3:
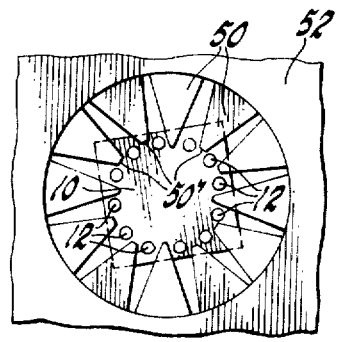
FIG. 3 is a top plan view of FIG. 2 along the lines 3—3.

Referring now to FIGS. 1–3 of the drawings, a semiconductor flip chip 10 is shown ready for transfer. Flip chip 10 is a silicon semiconductor integrated circuit die approximately 38 mils square and 11–13 mils thick between its two major faces. The flip chip 10 has a dozen spaced contact bumps 12 on its upper face equally spaced around its periphery. Each individual contact bump is approximately 0.8 mils high and 3.8 mils square. For ease of illustration, the contact bumps 12 are shown enlarged with respect to the chip 10. The contact bumps are a composite of layers of aluminum, chromium, nickel, tin and gold with the outermost layer being gold to permit making a eutectic bond with a gold-plated lead frame. While the foregoing bump construction is preferred, it can be varied. However, the nickel content should be at least about 30 percent, and preferably about 60 percent by volume of the total contact bump volume, as is the case in this example.

The nickel content provides a low reluctance path by which magnetic flux lines can readily pass through the contact bumps. The greater than 30 percent by volume nickel in effect gives the contact bumps characteristics of a soft ferromagnetic material. By soft ferromagnetic material we mean they have a high overall magnetic permeability and a low residual magnetization, with a low coercive field required. It should be noted that although nickel has been found to be the most practical metal to be used in production, other metals such as soft iron may be substituted therefor. If still other soft ferromagnetic materials are substituted, a larger volume proportion may be required if such other materials have a significantly lower magnetic permeability or other related magnetic characteristics, as should be understood by those skilled in the art.

As can be seen more clearly in FIG. 2, the back side of flip chip 10 is situated on the uppermost tip 14 of a vertical transfer probe 16 of transfer apparatus 18. Chip 10 seats on a flat portion of tip 14 that is horizontal and perpendicular to the longitudinal axis of probe 16. Probe 16 is approximately 36 mils in diameter and approximately ⅝ inch long. Probe 16 is a solid cylindrical rod of a soft ferromagnetic material such as soft iron. However, soft cold or hot rolled steel could be used. As one can see from the hidden lines in the drawings, the tip 14 of the probe 16 has a recess therein. The recess is approximately 25 mils in diameter and extends 20 mils deep into the uppermost end of the probe 16. This recess insures that magnetic flux lines transmitted through the probe 16 are concentrated around the periphery of the flip chip 10 thereon, where the flip chip contact bumps 12 are located. While the recess in the probe is preferred, it is not essential to this invention.

The lower end of probe 16 is mounted approximately ¼ inch deep within the upper end of probe holder 20 and secured therein by a set screw 22. Probe holder 20 is constructed of a soft ferromagnetic material such as hot rolled steel, but soft iron or cold rolled steel could also be used. It is approximately five-eighths inch in diameter, 2⅞ inches long and tapered at its upper end. Its lower end has a flange portion 24 which is approximately 1.245 inches in diameter and ¼ inch thick. Flange 24 is seated within a groove on the upper surface of annular stainless steel elevator base 32. The major longitudinal portion of probe holder 20, and the elevator base 32 have a concentric longitudinal cylindrical opening to receive the cylindrical upper end 26' of a stainless steel base guide 26. The upper end 26' of base guide 26 extends approximately 2¾ inches into the longitudinal openings within probe holder 20 and elevator base 32. The probe holder 20 and elevator base are fitted around base guide end 26' so that they slide easily vertically therealong without substantial horizontal deviation as later in this disclosure will be further described. The base guide 26 has a flange 28 at its lower end which is secured to aluminum mounting plate 30 as by screws 34. The upper surface of the flange 28 serves as a seat for the lower end of elevator base 32. The assembly thus far described is located between the arms 36 and 38 of a yoke portion of an aluminum lever 40. Elevator base 32 has two oppositely disposed and radially extending bosses 42 which rest on arms 36 and 38 of lever 40. Lever 40 is pivotally mounted on an aluminum fulcrum 43 which is attached to mounting plate 30. By depressing lever 40, the probe 16 and the members of the transfer apparatus 18 rigidly connected thereto can be vertically raised while keeping horizontally aligned as they slide along the cylindrical base guide end portion 26'.

Surrounding the periphery of bonding tip holder 20 and insulated therefrom, is electromagnet coil 44. The coil 44 is 1⅛ inch long and is constructed of No. 36 gauge enameled copper wire 63 turns long and 10 turns deep. Coil 44, in conjunction with bonding tip 16 and holder 20 which serve as a core, form an electromagnet. The electromagnet can be energized as is well known in the art by a typical DC power supply designated by the box in FIG. 1, which is series connected with the coil 44 and a switch 45. The power supply typically is one which can supply 0–20 volts and 0–1 ampere. Preferably, in practicing this invention, the power supply should provide about 15 volts and 0.45 ampere to the coil 44. An AC power supply may also be used, as is well known in the art.

It should be noted that the exact size and shape of the electromagnet can be varied, as can the current from the power supply. In fact, the number of coil turns comprising the electromagnet has been varied from 45 to 75 turns long, 5 to 15 turns deep, and between 1 inch and 2¼ inches in length. Furthermore, the current required for the coil previously described can be decreased to a minimum of 0.018 amperes with satisfactory results. When switch 45 is closed, a field is formed perpendicular to flip chip 10 and flux lines are concentrated by the probe 16 around the periphery of the flip chip 10.

Overlying flip chip 10 is a conductive metallic lead frame 46. Lead frame 46 is constructed of a soft ferromagnetic material such as Alloy 42 which has been coated with a thin layer of gold. Alloy 42 is an alloy containing, by weight, about 41.5 percent nickel, 0.05 percent carbon, 0.5 percent manganese, 0.25 percent silicon, and the balance iron. Lead frame 46 is approximately 10¼ inches long, 1¾ inches wide and 25 mils thick. Lead frame 46 has a plurality of sets 48 of mutually spaced inwardly converging cantilevered fingers 50, with the sets being spaced from each other and arranged in two parallel rows. The fingers in each set have free inner ends 50' arranged in a predetermined pattern which corresponds to the contact bump 12 pattern on semiconductor flip chip 10.

The gold-plated Alloy 42 lead frame has provided extremely satisfactory results. However, it is appreciated that the gold plating might be omitted if one did not want to attach the bumps by eutectic bonding. If another form of bump-finger attachment is used, another coating, more coatings, or no coatings may be preferred. For example, the fingers, the bumps, or both, may be solder coated. It appears that it is most important that the lead frame fingers be of the soft ferromagnetic material. If so, then only these portions need be of Alloy 42, or the like, and the balance of the lead frame can be of any other material. Analogously, the lead frame could be a laminate of a soft ferromagnetic material and any other material, including plastic.

Two identical cover plates 52 and 54 juxtaposed on opposite faces of lead frame 46 have a plurality of circular openings therein which expose sets 48 of the lead frame fingers 50. The cover plates 52 and 54 are generally coextensive to lead frame 46 and are constructed of SAE 300 series stainless steel which is approximately 1/16 inch thick. The cover plates can be constructed of aluminum or of any other suitable substantially nonferromagnetic material. The cover plates 52 and 54 sandwich the thin lead frame 46 therebetween to hold the sets 48 of fingers as much in the same plane as possible. The cover plates 52, 54 and lead frame 46 are secured in mutual registration by means of clamps 56 on the ends of arms 58 as can be seen in FIG. 1. The arms 58 are connected to a supporting automatic indexing mechanism as shown in FIG. 1. The lead frame 46 is supported parallel to the mounting plate 30 of the transfer apparatus 18, the mounting plate being secured to a flat, rigid surface (not shown) through mounting holes 60 therein. The automatic indexing mechanism moves the lead frame in the direction of the arrows of FIG. 1 to successively position the sets 48 of fingers 50 over the probe tip 16. It should be understood that the lead frame can be moved manually as well as automatically. A bonding torch 62, communicating with a source of a hot reducing or inert gas, is oriented to direct the hot gas against the upper surface of each finger set 48 moved over probe 16.

In accordance with the method of our invention, one set 48 of lead frame fingers is brought into position over probe 16 by the automatic indexing mechanism. The back side of semiconductor flip chip 10 is placed on tip 14 of probe 16 of the transfer apparatus in general alignment with the lead frame fingers. As one can see more clearly in FIGS. 2 and 3, the contact bumps on semiconductor flip chip 10 will probably be slightly misaligned with respect to their corresponding fingers 50 of lead frame 46. The electromagnet coil 44 is then energized by closing switch 46, and then the lever arm 40 is depressed. The depression of lever arm 40 vertically raises probe tip 16 with semiconductor flip chip 10 thereon into close proximity to but not into contact with the underside of the overlying set 48 of lead frame fingers 50.

Figure 4:
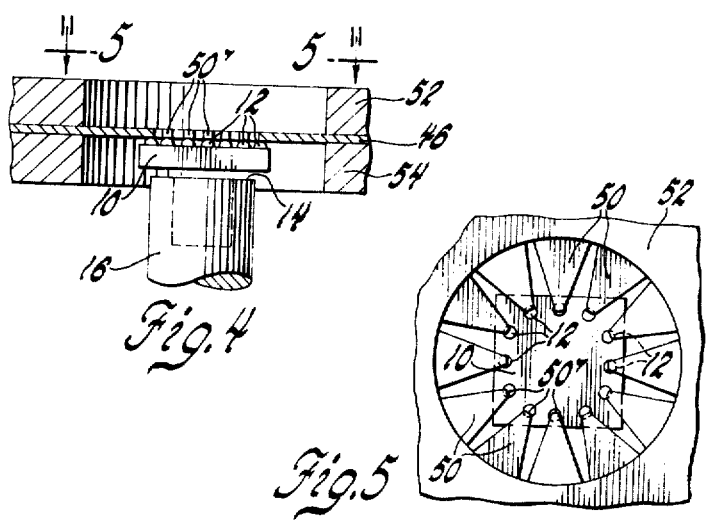
FIG. 4 is an enlarged partial sectional view analogous to FIG. 2 after chip transfer to the lead frame.
Figure 5:
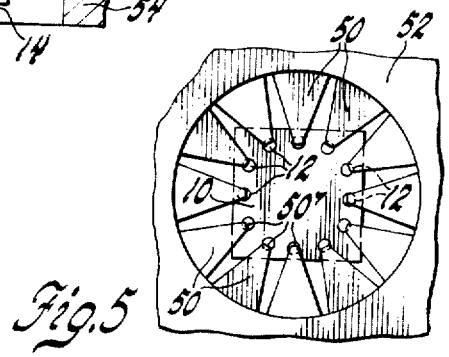
FIG. 5 is a top plan view of FIG. 4 along the lines 5—5.

When the flip chip 10 is close enough to the underside of the fingers 50, the magnetic force, which is transmitted through the soft ferromagnetic probe 16, raises the chip the rest of the way to the underside of the fingers 50, as can be seen in FIGS. 4 and 5. In moving from the probe toward the fingers, the flip chip also is concurrently automatically oriented by magnetic flux lines concentrated in lead frame fingers and the chip contact bumps so that when the contact bumps 12 engage their respective fingers 50, they are precisely aligned therewith. This orientation can occur before or after the chip raises off the probe but will always occur before the contact bumps 12 engage their respective fingers. The closer the chip comes to the fingers, the stronger is the orienting force applied.

Just how close the flip chip must be brought to the overlying lead frame fingers depends on various factors, such as the strength of the magnetic field from the electromagnet, the concentration of flux lines in the area of the chip and overlying fingers, the size and weight of the flip chip, and the size of the lead frame fingers, etc. Depending upon these variables, the contact bumps may have to be brought vertically to within only 8 mils of the fingers, or as close as 2 mils before it will raise and orient. Furthermore, we have found that the most consistent precise alignment occurs when the contact bumps are within close proximity of their corresponding finger free ends; that is, when the chip is maintained within about 10° of parallel with the plane of the finger set, when the contact bumps are brought to within 3 mils horizontal spacing of their respective finger free ends, and when the bump pattern is oriented to within 20° $\theta$ of the finger free end pattern, where theta ($\theta$) is measured with respect to an imaginary axis perpendicular to the lead frame and passing through the center of the finger set.

Once the engagement is made between the contact bumps 12 and fingers 50, they are permanently bonded together by a hot gas blast from bonding torch 62 while the magnetic force holds the chip against the lead frame. Typically, the hot gas is a nitrogen and hydrogen gas mixture at a temperature of approximately 500°C which is supplied from a source, designated by the box in FIG. 1, connected to the torch. The hot gas melts the tin in the bump, and gold outer surfaces of the contact bumps 12 and fingers 50 dissolve in the tin to form a melt. The hot gas is then removed, and the melt resolidifies to form a permanent electrical and mechanical connection between the flip chip bumps 12 and the lead frame fingers 50.

Figure 6:
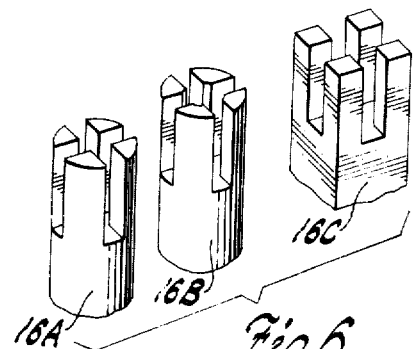
FIG. 6 is an enlarged isometric view showing a plurality of interchangeable probes for the apparatus shown in FIG. 1.

While the precise theoretical evaluation of this invention has not been completed, a general understanding can be ascertained. The electromagnetic coil 44 produces a magnetic field with flux lines concentrating on holder 20 which acts as an electromagnet core. The flux lines are transmitted to and concentrated in the soft ferromagnetic probe 16 which extends from the holder 20. The magnetic flux lines continue perpendicularly through the silicon of semiconductor flip chip 10 on the tip 16 and are densely concentrated in the soft ferromagnetic contact bumps 12 on the chip. When the probe brings the chip into close proximity with the lead frame 46, the magnetic flux lines transmitted through the contact bumps 12 take the path of lowest reluctance which is through the soft ferromagnetic fingers 50 of the lead frame 46. This concentration of flux lines in the contact bumps and the fingers causes the flip chip to transverse to the lead frame with the contact bumps automatically orienting themselves in precise register with their respective fingers of the lead frame. Furthermore, it appears that by using probes having tips 14 which have an effective surface area defined by its outer periphery which is slightly smaller than that of a major face of the chip 10, and which has indentation patterns therein, such as the interchangeable probes 16A, 16B, 16C in FIG. 6, the magnetic flux lines can be further concentrated in the areas of the contact bumps 12 to insure precision alignment. Depending upon the size of the chip and the pattern of contact bumps on the chip, the probe configuration can be modified to concentrate these lines of flux in the areas of the contact bumps.

As can be seen in FIG. 4, the fingers 50 of lead frame 46 are not overstressed by probe overtravel, as was common in the prior art. In our invention it is not necessary for the probe to contact the back side of the flip chip 10 after the magnetic force propels the flip chip to the lead frame. Therefore, all that is required from the probe is that it bring the flip chip into close proximity with the lead frame fingers and provide a concentrated magnetic field generally perpendicular to the chip and fingers. No manual alignment by rotating the probe 16 is required to register the contact bumps with their corresponding fingers of the lead frame. Therefore, substantial savings in time and expense, as well as uniform precision, can be had in practicing our invention. It should be noted that another advantage of our invention is that if the fingers 50 of a set 48 are not coplanar with one another, the magnetic field attracts the fingers to the flip chip contact bumps to provide an intimate engagement regardless as to initial non-planarity of the fingers or non-planarity in bump height. If the height of the contact bumps vary on one chip the finger portions bend only as needed intimately to engage their individual respective bump. In both cases a uniform intimate low stress bump finger engagement is obtained. As mentioned, in the prior art, upward bending and stressing of all fingers was required by manual transfer probe overtravel to insure intimate engagement of all bumps and bent fingers. Bonding occurred in this stress condition resulting in less reliable stressed bonds. Hence, this invention provides a method and apparatus for automatically precisely aligning semiconductor chips with lead frame structures so that improved low-stress bonds can be made therebetween.

Therefore, although this invention has been described in connection with certain specific examples thereof, no limitation is intended thereby except as defined in the appended claims.

We claim:

1. Apparatus for electromagnetically transferring integrally leaded semiconductor device chips to an overlying conductive lead frame structure and for automatically precisely aligning the chips therewith for producing a uniform low stress bond between integral chip leads and corresponding fingers of said lead frame, said apparatus comprising:

a probe for supporting an integrally leaded semiconductor device chip, said probe being of a soft ferromagnetic material so as to concentrate magnetic lines of flux in the area of the integral chip leads located thereon, said probe having an end portion upon which the chip can be supported, said end portion having a flat surface portion which is slightly smaller than a major face of the chip, a soft ferromagnetic support member for holding said probe vertically, a coil of electrically conductive wire surrounding said probe support member and being longitudinally spaced from said probe but coaxial therewith, means connected to said coil for passing current through said coil for a desired time period so that the coil produces magnetic flux lines which flow longitudinally through said probe and perpendicular to said chip for magnetically raising the chip from the probe and transferring it to the lead frame finger set in precisely aligned engagement therewith and means for vertically moving said probe, said support means and said coil as a unit to position said chip in closely spaced relation beneath an overlying set of lead frame fingers.

2. The apparatus of claim 1 in which said probe includes at least one indentation in said end portion for concentrating magnetic lines of flux toward peripheral portions of said probe above which integral leads on a semiconductor chip can be located.

* * * * *